(12) United States Patent
Brick et al.

(10) Patent No.: US 11,101,251 B2
(45) Date of Patent: Aug. 24, 2021

(54) OPTOELECTRONIC COMPONENT

(71) Applicant: OSRAM OLED GmbH, Regensburg (DE)

(72) Inventors: Peter Brick, Regensburg (DE);
Christopher Wiesmann, Barbing (DE);
Ulrich Streppel, Regensburg (DE);
David Racz, Regensburg (DE);
Christopher Kölper, Regensburg (DE);
Georg Roßbach, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 11 days.

(21) Appl. No.: 16/625,231

(22) PCT Filed: Jun. 22, 2018

(86) PCT No.: PCT/EP2018/000315
§ 371 (c)(1),
(2) Date: Dec. 20, 2019

(87) PCT Pub. No.: WO2018/233870
PCT Pub. Date: Dec. 27, 2018

(65) Prior Publication Data
US 2020/0144228 A1 May 7, 2020

(30) Foreign Application Priority Data

Jun. 22, 2017 (DE) .................... 10 2017 113 813.7
Jun. 23, 2017 (DE) .................... 10 2017 114 011.5

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/507* (2013.01); *H01L 33/52* (2013.01);
(Continued)

(58) Field of Classification Search
CPC ... H01L 25/0753; H01L 33/507; H01L 33/52; H01L 33/58; H01L 33/60; H01L 2933/0091
See application file for complete search history.

(56) References Cited

U.S. PATENT DOCUMENTS 9,368,549 B1 6/2016 Oraw et al.
2005/0116620 A1* 6/2005 Kobayashi .......... H01L 51/5271
313/503
(Continued)

FOREIGN PATENT DOCUMENTS

DE         103 06 870 A1   9/2004
DE   10 2006 040 641 A1   3/2008
(Continued)

*Primary Examiner* — Jay C Chang
*Assistant Examiner* — Mikka Liu
(74) *Attorney, Agent, or Firm* — DLA Piper LLP (US)

(57) ABSTRACT

An optoelectronic component includes a carrier, wherein the carrier includes a surface, reflective barriers are formed over the surface of the carrier, the reflective barriers divide the surface of the carrier into pixels, each pixel respectively includes at least one optoelectronic semiconductor chip arranged on the surface of the carrier, the optoelectronic semiconductor chip is configured to emit electromagnetic radiation, the optoelectronic semiconductor chip includes an upper side, the upper side faces away from the surface of the carrier, and a reflective covering is arranged on the upper side of the optoelectronic semiconductor chip.

13 Claims, 3 Drawing Sheets

(51) Int. Cl.
    *H01L 33/52*     (2010.01)
    *H01L 33/58*     (2010.01)
    *H01L 33/60*     (2010.01)

(52) U.S. Cl.
    CPC .............. *H01L 33/58* (2013.01); *H01L 33/60* (2013.01); *H01L 2933/0091* (2013.01)

(56) References Cited

U.S. PATENT DOCUMENTS

| | | | | |
|---|---|---|---|---|
| 2007/0102718 | A1* | 5/2007 | Takekuma | ............. G02B 6/003 |
| | | | | 257/98 |
| 2010/0053976 | A1* | 3/2010 | Cornelissen | ........... G02B 5/124 |
| | | | | 362/297 |
| 2011/0006316 | A1 | 1/2011 | Ing et al. | |
| 2014/0285088 | A1 | 9/2014 | Windisch | |
| 2015/0049510 | A1 | 2/2015 | Haiberger et al. | |
| 2015/0311407 | A1 | 10/2015 | Göötz et al. | |
| 2017/0133357 | A1* | 5/2017 | Kuo | .................... H01L 25/0753 |
| 2018/0358522 | A1 | 12/2018 | Schwarz et al. | |

FOREIGN PATENT DOCUMENTS

| | | |
|---|---|---|
| DE | 10 2011 085 645 A1 | 5/2013 |
| DE | 10 2015 118 433 A1 | 5/2017 |
| EP | 2 071 640 A1 | 6/2009 |
| WO | 2013/118076 A1 | 8/2013 |
| WO | 2013/135696 A1 | 9/2013 |
| WO | 2014/090893 A1 | 6/2014 |

\* cited by examiner

OPTOELECTRONIC COMPONENT

TECHNICAL FIELD

This disclosure relates to an optoelectronic component.

BACKGROUND

Backlighting units based on LED arrangements are known. Improved optoelectronic components are nonetheless needed.

SUMMARY

We provide an optoelectronic component including a carrier, wherein the carrier includes a surface, reflective barriers are formed over the surface of the carrier, the reflective barriers divide the surface of the carrier into pixels, each pixel respectively includes at least one optoelectronic semiconductor chip arranged on the surface of the carrier, the optoelectronic semiconductor chip is configured to emit electromagnetic radiation, the optoelectronic semiconductor chip includes an upper side, the upper side faces away from the surface of the carrier, and a reflective covering is arranged on the upper side of the optoelectronic semiconductor chip.

LIST OF REFERENCES

Figure 1:
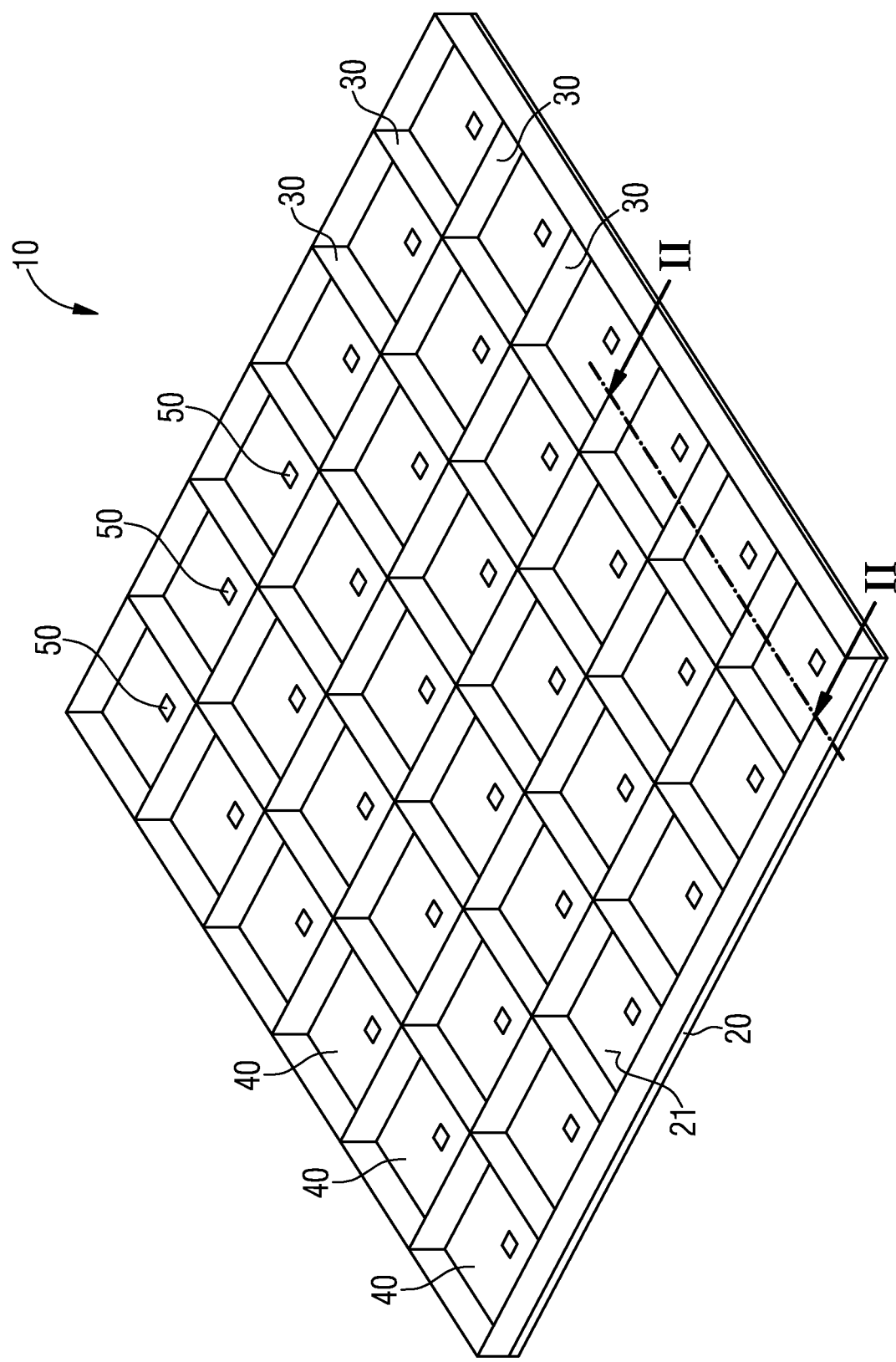
FIG. 1 shows a schematic representation of a three-dimensional representation of a part of an optoelectronic component.

10 optoelectronic component
20 carrier
21 surface of the carrier
30 reflective barrier
40 pixels
50 optoelectronic semiconductor chip
51 upper side of an optoelectronic semiconductor chip
52 lower side of an optoelectronic semiconductor chip
53 side facet of an optoelectronic semiconductor chip
54 reflective covering of an optoelectronic semiconductor chip
60 lightguide structure
61 upper side of the lightguide structure
62 lower side of the lightguide structure
63 recesses in the lightguide structure
64 interface between lightguide structure and recesses
70 encapsulation material
71 lens
80 scattering film
90 wavelength-converting layer

DETAILED DESCRIPTION

Our optoelectronic component comprises a carrier having a surface. Reflective barriers are formed over the surface of the carrier. The reflective barriers divide the surface of the carrier into pixels. Each pixel respectively comprises at least one optoelectronic semiconductor chip arranged on the surface of the carrier. The optoelectronic semiconductor chip is configured to emit electromagnetic radiation. Advantageously, the optoelectronic component comprises pixels having low crosstalk because of the reflective barriers arranged over the surface of the carrier. Electromagnetic radiation emitted by an optoelectronic semiconductor chip inside one pixel is thus not transmitted to neighboring pixels. The optoelectronic component therefore has a high contrast range.

A lightguide structure may be arranged over the optoelectronic semiconductor chip. The lightguide structure may comprise recesses. Advantageously, electromagnetic radiation emitted by the optoelectronic semiconductor chip may be totally internally reflected at least partially on an upper side and on a lower side of the lightguide structure. This may lead to lateral transport of the electromagnetic radiation inside a pixel. Partial lateral transport of the electromagnetic radiation inside a pixel makes it possible to produce flat optoelectronic components.

The recesses may form the reflective barriers. Advantageously, electromagnetic radiation may be totally internally reflected at the recesses so that it does not enter a neighboring pixel.

The reflective barriers may be arranged in the recesses. Advantageously, a reflective barrier arranged inside a recess may prevent electromagnetic radiation which has not been totally internally reflected at the recess from being transmitted into a neighboring pixel.

An upper side, facing away from the surface of the carrier, of the lightguide structure may comprise output coupling structures. Advantageously, the electromagnetic radiation emitted by the optoelectronic semiconductor chips may be coupled out from the lightguide structure.

A lower side, facing toward the surface of the carrier, of the lightguide structure may comprise output coupling structures. Advantageously, electromagnetic radiation may be scattered by the output coupling structures arranged on the lower side of the lightguide structure such that there is a favorable angle of incidence in relation to the upper side of the lightguide structure so that emergence of the electromagnetic radiation on the upper side is made possible.

The reflective barriers may comprise a reflective material. Advantageously, the electromagnetic radiation is not transmitted into a neighboring pixel by reflective barriers comprising a reflective material.

The reflective barriers may have a cross section along a section plane perpendicular to the surface of the carrier that tapers away from the surface of the carrier. Advantageously, electromagnetic radiation emitted by the optoelectronic semiconductor chips is reflected at reflective barriers, which have a cross section tapering away from the surface of the carrier such that the reflected electromagnetic radiation can emerge from the respective pixels.

A reflective covering may be arranged on an upper side, facing away from the surface of the carrier, of the optoelectronic semiconductor chip. Advantageously, a reflective covering arranged on the upper side of the optoelectronic semiconductor chip reduces emission of electromagnetic radiation on the upper side of the optoelectronic semiconductor chip and enhances laterally directed emission on side facets of the optoelectronic semiconductor chip. The electromagnetic radiation emitted by the optoelectronic semiconductor chip is in this way distributed inside the associated pixel before it emerges from the pixel. This produces a uniform emission characteristic of the pixel. Increased lateral emission of the optoelectronic semiconductor chip is also advantageous with a view to producing an optoelectronic component that is as flat as possible. Typically, flat backlighting units are produced by electromagnetic radiation coupled laterally into a thin lightguide structure. The electromagnetic radiation coupled into the lightguide structure may then be coupled out in the desired regions of the lightguide structure. In contrast thereto, the arrangement of a reflective covering on the upper side of the optoelectronic semiconductor chip a priori allows laterally directed emission of electromagnetic radiation. A flat backlighting unit may therefore be provided. If the laterally directed emission were suppressed, there would be an emission cone on the upper side of the optoelectronic semiconductor chip. So that the electromagnetic radiation can be emitted while being distributed as much as possible over the entire pixel, i.e., so that the emission cone is spread out as much as possible before it emerges from the optoelectronic component, the optoelectronic component would need to have a relatively large overall height.

The optoelectronic semiconductor chip may be embedded in an encapsulation material. Advantageously, the optoelectronic semiconductor chip is protected against external influences by the embedding in an encapsulation material.

The encapsulation material may form a lens. Advantageously, a lens, in which the optoelectronic semiconductor chip is embedded, may increase the output coupling efficiency of the electromagnetic radiation.

A scattering film may be arranged over the optoelectronic semiconductor chip. Advantageously, a scattering film produces a homogeneous emission characteristic of the optoelectronic component.

A wavelength-converting layer may be arranged over the optoelectronic semiconductor chip. Advantageously, the wavelength of the electromagnetic radiation emitted by the optoelectronic semiconductor chip may be modified in a desired way.

The optoelectronic semiconductor chip may be a volume-emitting light-emitting diode chip. Advantageously, a volume-emitting light-emitting diode chip emits electromagnetic radiation not only on its upper side but also on its side facets. Laterally directed emission makes it possible to produce flat illumination units when emission on the surface is suppressed.

The above-described properties, features and advantages, as well as the way in which they are achieved, will become more clearly and readily comprehensible in conjunction with the following description of the examples, which will be explained in more detail in connection with the drawings.

FIG. 1 shows a three-dimensional schematic representation of a part of a first example of an optoelectronic component 10. Some parts of the optoelectronic component are not represented for reasons of clear representation.

Figure 2:
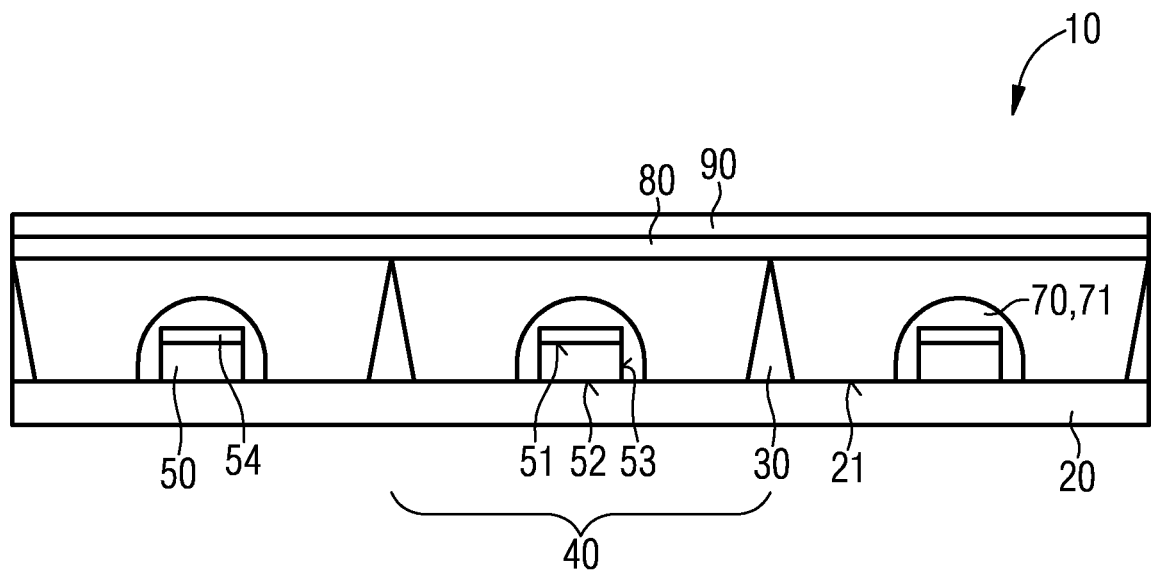
FIG. 2 shows a schematic representation of a part of the optoelectronic component represented in FIG. 1 in a sectional view along the connecting line II-II shown in FIG. 1.

FIG. 2 shows a part of the optoelectronic component 10 represented in FIG. 1 in a schematic sectional view along the connecting line II-II shown in FIG. 1.

The optoelectronic component 10 comprises a carrier 20. The carrier 20 comprises a surface 21. The carrier 20 may, for example, be a metal, semiconductor, semiconductor oxide, glass, plastic or ceramic substrate. The carrier 20 may also be a printed circuit board (PCB).

Reflective barriers 30 are formed over the surface 21 of the carrier 20. The reflective barriers 30 divide the surface 21 of the carrier 20 into pixels 40. In the sectional view shown in FIG. 2 along a plane extending perpendicularly to the surface 21 of the carrier 20 and parallel to the connecting line II-II, the reflective barriers 30 have a cross section tapering away from the surface 21 of the carrier 20. As an example therefor, the reflective barriers 30 represented in FIG. 2 have a triangular cross section tapering away from the surface 21 of the carrier 20. It is also possible for the reflective barriers 30 to have, for example, a trapezoidal cross section. The height of the reflective barriers 30 may, for example, be 10 mm.

The pixels 40 may, for example, be arranged in a regular matrix. In the example shown in FIG. 1, the optoelectronic component 10 comprises a regular matrix having 6×6 square pixels 40. The number of pixels 40 and their shape may, however, differ from the variant shown in FIG. 1. The edge length of a pixel 40 may, for example, be 10 mm to 40 mm.

The reflective barriers 30 may be arranged over the surface 21 of the carrier 20. In this example, the reflective barriers 30 may comprise a silicone, epoxide or another plastic and be arranged over the surface 21 of the carrier 20 by an injection-molding method. The reflective barriers 30 may, however, also be arranged over the surface 21 by deep drawing. The reflective barriers 30 may, however, also be provided by the surface 21 of the carrier 20 being selectively etched so that the reflective barriers 30 are formed from the material of the carrier 20 and form a monolithic composite body with the carrier 20.

Each pixel 40 respectively comprises at least one optoelectronic semiconductor chip 50 arranged on the surface 21 of the carrier 20. The optoelectronic semiconductor chip 50 comprises an upper side 51, a lower side 52 and side facets 53. The optoelectronic semiconductor chip 50 is arranged with its lower side 52 on the surface 21 of the carrier 20. The optoelectronic semiconductor chip 50 is configured to emit electromagnetic radiation and may, for example, be a light-emitting diode chip. The light-emitting diode chip may, for example, be volume-emitting. In this example, the optoelectronic semiconductor chip 50 emits electromagnetic radiation on its upper side 51 and on its side facets 53.

The optoelectronic semiconductor chip 50 may comprise contact pads on its upper side 51 or on its lower side 52 to supply the optoelectronic semiconductor chip 50 with electrical energy and may, for example, be arranged on a lead frame (not represented in FIG. 2) integrated into the carrier 20. The lead frame may, however, also be integrated in a mounting substrate in which case the optoelectronic semiconductor chip 50 together with the mounting substrate may be arranged on the surface 21 of the carrier 20 (this is not represented in FIG. 2). As an alternative, the optoelectronic semiconductor chip 50 may comprise a contact pad on its upper side 51 and a contact pad on its lower side 52. Contact pads located on the upper side 51 of the optoelectronic semiconductor chip 50 may, for example, be connected via bond wires to a lead frame or other electrodes.

The optoelectronic semiconductor chip 50 may comprise a reflective covering 54 arranged on its upper side 51. The reflective covering 54 may, for example, comprise a metalization, a dielectric mirror, a Bragg mirror or a silicone, an epoxide or another plastic with scattering particles embedded therein. The reflective covering 54 reduces the emission of electromagnetic radiation on the upper side 51 of the optoelectronic semiconductor chip 50 and enhances the emission on the side facets 53. As explained above, the thickness of the optoelectronic component 10 may be reduced as a result of increased lateral emission of electromagnetic radiation.

Furthermore, the optoelectronic semiconductor chip 50 may be embedded in an encapsulation material 70. In the example shown in FIG. 2, the encapsulation material 70 is a spherical lens 71. The lens 71 may be provided to shape the output coupling of the electromagnetic radiation.

The lens 71 may be suitable for suppressing emission of electromagnetic radiation on the upper side 51 of the optoelectronic semiconductor chip 50. To this end, the lens 71 would comprise a hollow facing away from the surface 21 of the carrier 20. In this example, the reflective covering 54 may be omitted.

The reflective barriers 30 are configured to decouple individual pixels 40 optically from one another. The reflective barriers 30 therefore prevent crosstalk between individual pixels 40 and allow a large dynamic range of the optoelectronic component 10. The dynamic range in this example refers to the contrast range, i.e., a ratio between maximum and minimum radiation density of two pixels 40 of the optoelectronic component 10.

To avoid crosstalk between individual pixels 40, the reflective barriers 30 comprise a reflective material. To this end, the reflective barriers 30 may, for example, comprise reflective coatings. If the reflective barriers 30 comprise a silicone, an epoxide or another plastic, as an alternative scattering particles or scattering pores, for example, air inclusions may also be embedded in the plastic to reflect electromagnetic radiation. As an alternative, the reflective barriers 30 may, for example, be prisms or reflectors.

A reflective coating may also be arranged between the optoelectronic semiconductor chips 50 and the reflective barriers 30 on the surface 21 of the carrier 20. It is also possible for the reflective barriers 30 and the reflective coating to be formed continuously on the surface 21 of the carrier 20. The reflective barriers 30 formed continuously with the reflective coating may, for example, be arranged on the surface 21 of the carrier 20 by injection molding or deep drawing.

The optoelectronic component 10 represented in FIG. 2 furthermore comprises a scattering film 80 and a wavelength-converting layer 90. The scattering film 80 is arranged over the optoelectronic semiconductor chip 50. The wavelength-converting layer 90 is arranged over the optoelectronic semiconductor chip. Both the scattering film 80 and the wavelength-converting layer 90 are not represented in FIG. 1 for the sake of clarity. In the representation of FIG. 2, the wavelength-converting layer 90 is arranged over the scattering film 80. The scattering film 80 may, however, also be arranged over the wavelength-converting layer 90.

The scattering film 80 may comprise a plastic, for example, polyvinyl chloride (PVC), polymethyl methacrylate (PMMA) or polycarbonate (PC). The scattering film 80 is intended to scatter electromagnetic radiation. The scattering film 80 may also be referred to as a diffuser. In addition, the scattering film 80 may be structured inhomogeneously. For example, the scattering film 80 may comprise a modulation in respect of its thickness.

A scattering film 80 may smooth the angular distribution of emitted electromagnetic radiation. However, a scattering film 80 is not necessarily configured to compensate for a spatial inhomogeneity of the electromagnetic radiation. This is the case in particular if the scattering film 80 only comprises a plastic. To compensate for a spatial inhomogeneity of the emitted electromagnetic radiation, the scattering film 80 may additionally comprise volume-scattering particles. These may, for example, be titanium dioxide particles, aluminum oxide particles, plastic or pores, for example, air inclusions. A scattering film 80 with volume scatterers embedded therein produces a homogeneous distribution of the electromagnetic radiation emitted by the optoelectronic component 10.

The wavelength-converting layer 90 may comprise a silicone, an epoxide or another plastic. It is intended to modify the wavelength of the electromagnetic radiation emitted by the optoelectronic semiconductor chip 50. To this end, the wavelength-converting layer 90 may, for example, comprise embedded wavelength-converting particles. If the optoelectronic semiconductor chip 50 emits blue light, for example, the wavelength-converting layer 90 may convert a part of the blue light into yellow light so that an observer perceives a superposition of the originally emitted light and the converted light, i.e., in this example white light. The wavelength-converting layer 90 may, however, also be omitted.

Figure 3:
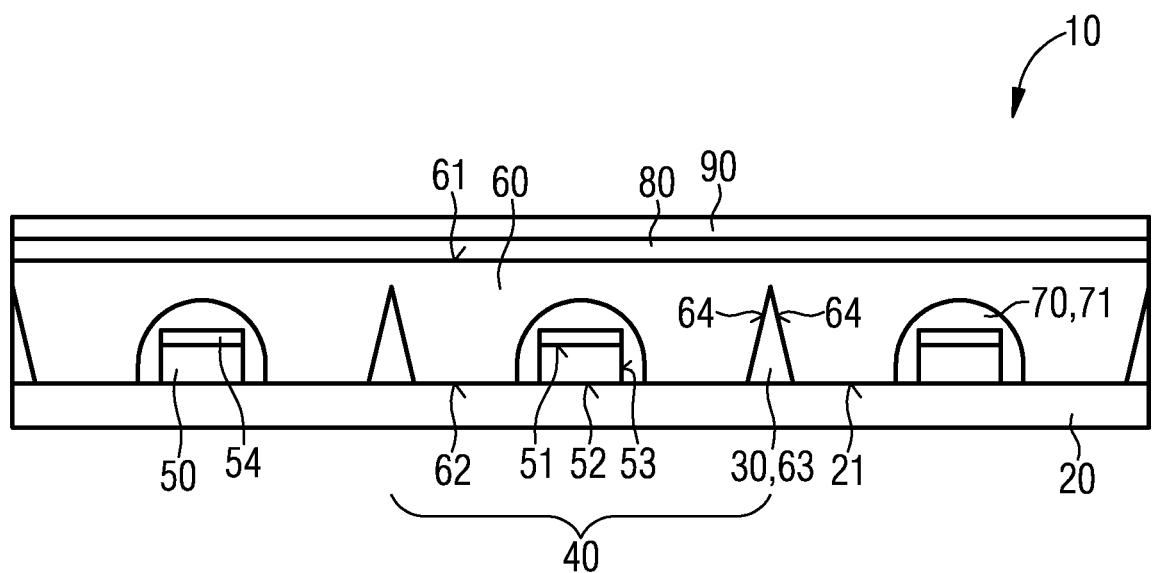
FIG. 3 shows a schematic representation of a part of one example of the optoelectronic component in a sectional view corresponding to the sectional view in FIG. 2.

FIG. 3 shows a schematic sectional view of a further example of the optoelectronic component 10 in a similar way to FIG. 2. The optoelectronic component 10 represented in FIG. 3 has a great similarity to the optoelectronic component 10 shown in FIG. 2. The references apply according to FIG. 2. Only the differences will be explained below.

The variant of the optoelectronic component 10 as represented in FIG. 3 comprises a lightguide structure 60 arranged over the optoelectronic semiconductor chip 50. The lightguide structure 60 comprises an upper side 61 and a lower side 62 facing away from the upper side 61. The lightguide structure 60 is arranged with its lower side 62 over the surface 21 of the carrier 20. An air gap may be formed between the surface 21 of the carrier 20 and the lower side 62 of the lightguide structure 60.

The lightguide structure 60 is intended to guide electromagnetic radiation laterally inside a pixel 40. In this example, total internal reflection of the electromagnetic radiation emitted by the optoelectronic semiconductor chip 50 may take place on the upper side 61 and the lower side 62 of the lightguide structure 60. The lightguide structure 60 may, for example, comprise glass, a silicone, an epoxide or another plastic.

To suppress crosstalk of individual pixels 40, the lightguide structure 60 comprises recesses 63. In the variant shown in FIG. 3, the recesses 63 form the reflective barriers 30. Interfaces 64 are formed between the lightguide structure 60 and the recesses 63. Electromagnetic radiation which propagates through the lightguide structure is totally internally reflected at the interfaces 64 between the lightguide structure 60 and the reflective barriers 30.

The interfaces 64 may additionally comprise reflective coatings, for example, metallic or dielectric coatings.

The lightguide structure 60 may also comprise further recesses to receive optoelectronic semiconductor chips 50. As an alternative, optoelectronic semiconductor chips 50 may also have been embedded in the lightguide structure 60. Electromagnetic radiation emitted by optoelectronic semiconductor chips 50 may be coupled into the lightguide structure 60.

In FIG. 3, the lightguide structure 60 is represented as a continuous structure which extends over all the pixels 40. For this reason, the recesses 63, or the reflective barriers 30, do not extend as far as the scattering film 80. There is therefore the possibility of partial crosstalk between the pixels 40. This, however, may be suppressed. The optoelectronic component 10 may also comprise a multiplicity of lightguide structures 60. For example, the optoelectronic component 10 may comprise one lightguide structure 60 per pixel 40 so that all the lightguide structures 60 are fully decoupled from one another. The crosstalk between the pixels 40 would be reduced. Each lightguide structure 60 may in this example be configured such that the recesses 63, or the reflective barriers 30, between two neighboring lightguide structures 60 comprise a cross section corresponding to the cross section in FIG. 3 tapering away from the surface 21 of the carrier 20. When the optoelectronic component 10 comprises one lightguide structure 60 per pixel 40, it is expedient for the lightguide structures 60 of neighboring pixels 40 to be monolithically connected to one another by narrow webs. This reduces crosstalk of neighboring pixels 40 without a multiplicity of lightguide structures 60 having to be arranged.

So that the electromagnetic radiation emitted by the optoelectronic semiconductor chips 50 can be coupled out from the lightguide structure 60, the lightguide structure 60 comprises output coupling structures (not represented in FIG. 3) on its upper side 61. The output coupling structures break the total internal reflection on the upper side 61 of the lightguide structure 60. The output coupling structures may, for example, be prism structures. It is possible for the output coupling structures to be produced by injection molding during the formation of the lightguide structure 60.

Output coupling structures may also be arranged on the lower side 62 of the lightguide structure 60. Electromagnetic radiation may then be scattered at the output coupling structures arranged on the lower side 62 of the lightguide structure 60 such that there is a favorable angle of incidence in relation to the upper side 61 of the lightguide structure 60 so that emergence of the electromagnetic radiation on the upper side 61 is made possible.

A further reflective coating may be arranged on the lower side 62 of the lightguide structure 60. Such a coating may, however, also be omitted.

The lightguide structure 60 may be configured such that the thickness of the lightguide structure 60 is modulated inside a pixel 40. For example, the thickness of the lightguide structure 60 may decrease toward the reflective barriers 30. This likewise promotes output coupling of electromagnetic radiation on the upper side 61 of the lightguide structure 60. Output coupling structures may in this example be obviated, although a combination of features may be selected so that the lightguide structure 60 comprises both output coupling structures and a thickness modulation so that the output coupling efficiency is increased further.

Figure 4:
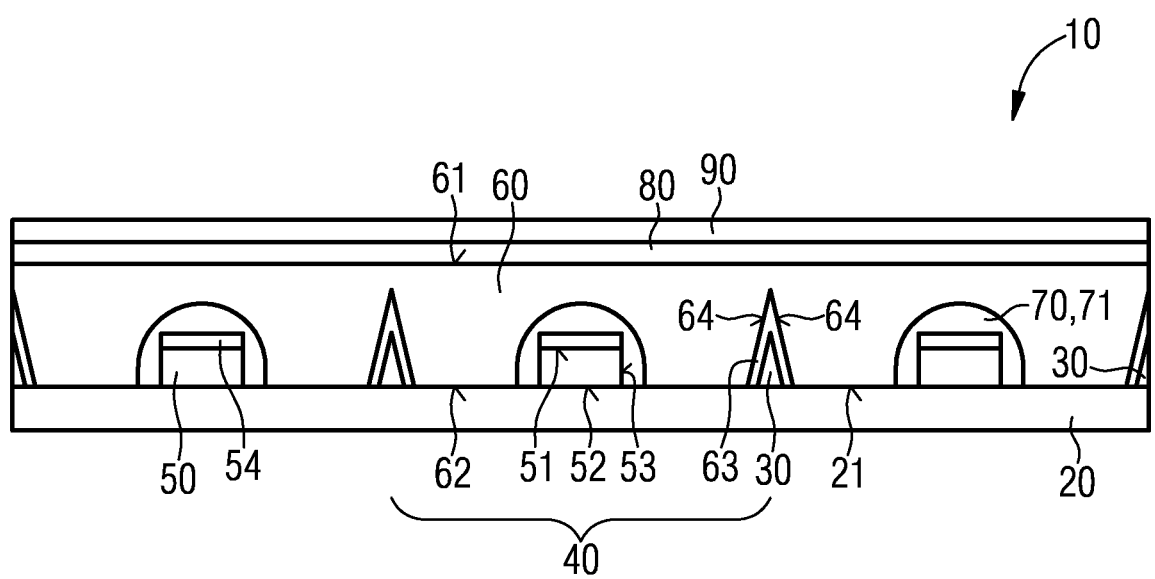
FIG. 4 shows a schematic representation of a part of one example of the optoelectronic component in a sectional view corresponding to the sectional view in FIG. 3.

In a similar way to FIG. 3, FIG. 4 shows a schematic sectional view of a further example of the optoelectronic component 10. The optoelectronic component 10 represented in FIG. 4 has a great similarity to the optoelectronic component 10 shown in FIG. 3. The references apply according to FIG. 3. Only the differences will be explained below.

The variant of the optoelectronic component 10 shown in FIG. 4 comprises a lightguide structure 60, in the recesses 63 of which the reflective barriers 30 are arranged. In the example shown, the reflective barriers 30 do not entirely fill the recesses 63. The reflective barriers 30 may, however, also entirely fill the recesses 63.

Both the recesses 63 and the reflective barriers 30 arranged therein have a cross section tapering away from the surface 21 of the carrier 20. In the example represented, the recesses 63 and the reflective barriers 30 have a triangular cross section. This, however, is not mandatory. For example, the recesses 63 and/or the reflective barriers 30 may have a trapezoidal cross section tapering away from the surface 21 of the carrier.

The reflective barriers 30 arranged in the recesses 63 may, for example, comprise a silicone, an epoxide or another plastic with scattering particles or scattering pores embedded therein. The reflective barriers 30 may, however, also form a monolithic composite body with the carrier 20 and comprise the material of the carrier 20.

The arrangement of the reflective barriers 30 inside the recesses 63 of the lightguide structure 60 reduces crosstalk between two neighboring pixels 40. Electromagnetic radiation emitted by an optoelectronic semiconductor chip 50 need not necessarily be totally internally reflected at the interfaces 64. If the electromagnetic radiation passes through an interface 64 into a recess 63, a reflective barrier 30 arranged in the recess 63, which does not entirely fill the recess 63, may suppress the transmission into a neighboring pixel 40.

The optoelectronic component 10 may, for example, be a backlighting unit. Overall, the optoelectronic component is configured such that laterally directed emission of the optoelectronic semiconductor chips 50 and laterally directed transport of the electromagnetic radiation inside a pixel 40 are maximized as far as possible. In this way, a backlighting unit may be configured to be particularly flat. Furthermore, such a backlighting unit has a high contrast range since the reflective barriers 30 suppress crosstalk between the pixels 40.

Our components have been illustrated and described in detail with the aid of the preferred examples. This disclosure is not, however, restricted to the examples disclosed. Rather, other variants may be derived therefrom by those skilled in the art without departing from the protective scope of the appended claims.

This application claims priorities of DE 10 2017 113 813.7 and DE 10 2017 114 011.5, the subject matter of which is incorporated herein by reference.

The invention claimed is:

1. An optoelectronic component comprising:
a carrier,
wherein
the carrier comprises a surface,
reflective barriers are formed over the surface of the carrier,
the reflective barriers divide the surface of the carrier into pixels,
each pixel respectively comprises at least one optoelectronic semiconductor chip arranged on the surface of the carrier,
the optoelectronic semiconductor chip is configured to emit electromagnetic radiation,
the optoelectronic semiconductor chip comprises an upper side,
the upper side faces away from the surface of the carrier, and
a reflective covering is arranged directly on the upper side of the optoelectronic semiconductor chip.

2. The optoelectronic component according to claim 1, wherein a lightguide structure is arranged over the optoelectronic semiconductor chip, and the lightguide structure comprises recesses.

3. The optoelectronic component according to claim 2, wherein the recesses form the reflective barriers.

4. The optoelectronic component according to claim 2, wherein the reflective barriers are arranged in the recesses.

5. The optoelectronic component according to claim 2, wherein the lightguide structure comprises an upper side, the upper side faces away from the surface of the carrier, and the upper side of the lightguide structure comprises output coupling structures.

6. The optoelectronic component according to claim 2, wherein the lightguide structure comprises a lower side, the lower side faces toward the surface of the carrier, and the lower side of the lightguide structure comprises output coupling structures.

7. The optoelectronic component according to claim 1, wherein the reflective barriers comprise a reflective material.

8. The optoelectronic component according to claim 1, wherein the reflective barriers have a cross section along a section plane perpendicular to the surface of the carrier tapering away from the surface of the carrier.

9. The optoelectronic component according to claim 1, wherein the optoelectronic semiconductor chip is embedded in an encapsulation material.

10. The optoelectronic component according to claim 9, wherein the encapsulation material forms a lens.

11. The optoelectronic component according to claim 1, wherein a scattering film is arranged over the optoelectronic semiconductor chip.

12. The optoelectronic component according to claim 1, wherein a wavelength-converting layer is arranged over the optoelectronic semiconductor chip.

13. The optoelectronic component according to claim 1, wherein the optoelectronic semiconductor chip is a volume-emitting light-emitting diode chip.

* * * * *